United States Patent [19]

Tamaki et al.

[11] 4,126,880
[45] Nov. 21, 1978

[54] GERMANIUM-CONTAINING SILICON NITRIDE FILM

[75] Inventors: Yoichi Tamaki; Seiichi Isomae, both of Kokubunji; Masahiko Ogirima, Tokyo; Akira Shintani, Hachioji; Michiyoshi Maki, Kokubunji, all of Japan

[73] Assignee: Hitachi, Ltd., Japan

[21] Appl. No.: 756,863

[22] Filed: Jan. 4, 1977

[30] Foreign Application Priority Data

Feb. 13, 1976 [JP] Japan ............................. 51/14027
Mar. 10, 1976 [JP] Japan ............................. 51/25150

[51] Int. Cl.$^2$ ..................... B05D 5/12; B32B 9/04; C04B 35/16; H01L 29/14
[52] U.S. Cl. ....................................... 357/54; 357/52; 428/446; 428/336; 427/94; 427/255; 427/272; 106/73.5
[58] Field of Search ............... 427/93, 94, 82, 255, 427/272; 428/446, 336; 106/73.5; 357/52, 54

[56] References Cited

U.S. PATENT DOCUMENTS 3,558,348  1/1977  Rand ..................................... 427/94
3,669,693  6/1972  Dalton ................................... 427/94

OTHER PUBLICATIONS

Westdorp et al., Stress Effects of $Si_3N_4$ on Silicon, Symposium on Deposited Dielectric Films, Montreal 1968.
Carlsen, Mult. Dif. for Integrated Circuit Devices, I.B.M. Tech. Disclosure Bulletin, vol. 9, No. 10, Mar. 1967.

Primary Examiner—Ronald H. Smith
Assistant Examiner—Richard Bueker
Attorney, Agent, or Firm—Craig & Antonelli

[57] ABSTRACT

A germanium-containing silicon nitride film has a germanium content of 0.5 to 10 atomic-% that of the silicon content. Since the film has a much smaller stress than a conventional silicon nitride ($Si_3N_4$) film, it is very suitable as a mask for fabricating a semiconductor device and an insulating or a protective film for a semiconductor device.

15 Claims, 5 Drawing Figures

GERMANIUM-CONTAINING SILICON NITRIDE FILM

BACKGROUND OF THE INVENTION

1. Field of the Invention

The present invention relates to a thin film which is suitable for insulation or protection in a semiconductor device, a mask in the fabrication of a semiconductor device, etc.

2. Description of the Prior Art

A variety of films including silica ($SiO_2$) films, alumina ($Al_2O_3$) films, silicon nitride ($Si_3N_4$) films, etc., are used as protective films or insulating films of semiconductor devices, and as oxidation masks or diffusion masks in the fabrication of semiconductor devices, etc.

Especially, a silicon nitride film is extensively employed owing to advantages that it is chemically inert, that it is less prone to oxidation, and that ions of sodium etc., do not readily penetrate it.

However, there is a serious problem that when silicon nitride is directly deposited on the surface of a semiconductor substrate or glass, on an interconnection layer, or the like, a large stress acts on the substrate, the glass, the interconnection layer, or the like, to give rise to such defects as cracks and dislocations in the substrate or the like. The magnitude of the stress acting on the substrate or the like becomes greater as the film of the deposited silicon nitride becomes thicker. By way of example, when a silicon nitride film having a thickness of about 1 μm is deposited on a silicon substrate, the silicon substrate warps and can even break.

In order to prevent such an influence of silicon nitride, there has heretofore been proposed a method in which another film, for example, a silica film or a silicon oxynitride (SiON) film is initially deposited on the substrate or the like, and the silicon nitride film is superposed and deposited thereon.

With this measure, it is possible to prevent the influence of the stress which acts from the silicon nitride film on the substrate or the like. The method, however, renders the fabricating process complicated. Moreover, since two films must be used, errors during the process are an important cause for obstructing the attainment of a minute semiconductor device or the enhancement of the density of integration.

SUMMARY OF THE INVENTION

An object of the invention is to solve the problems of the prior art and to provide a thin film for semiconductor devices which exhibits a very small stress acting on a substrate, an interconnection layer or the like and which has properties close to those of a silicon nitride film.

In order to accomplish the object, the invention relates to the formation of a film in which silicon nitride contains 0.5 to 10 atomic-% of germanium with respect to silicon, whereby a stress induced in the film is made remarkably lower than in the case of only silicon nitride.

DETAILED DESCRIPTION OF THE INVENTION

Although the cause and mechanism of the generation of a stress in a silicon nitride film are not clear, the stress has been observed in the process of depositing a silicon nitride film on a substrate or the like by CVD (chemical vapor deposition).

The stress created in the silicon nitride film cannot be readily sharply lowered even by changing depositing conditions of the silicon nitride film or a depositing method therefor. Improvements from this standpoint can hardly be expected.

By doping silicon nitride with a predetermined amount of germanium, the invention has succeeded in remarkably lowering the stress only without any substantial change of the various properties of the silicon nitride film as previously mentioned.

The reason why such an effect is produced by doping silicon nitride with germanium is not clear. It is assumed, however, that since the atomic radius of germanium is conspicuously large as compared with that of silicon, under the coexistence of germanium atoms and silicon atoms the packing of the silicon nitride molecules in the film will be prevented from becoming excessively dense, with the result that the generation of the stress will be markedly reduced.

Germanium is a neutral element which becomes neither an acceptor nor a donor. Therefore, even when silicon nitride is doped with germanium, the electrical characteristics of silicon nitride are scarcely affected, and the aforecited excellent properties as a film for a semiconductor device and the fabrication thereof remain unchanged.

The germanium-containing silicon nitride film can be easily formed on a silicon single crystal by the CVD process in which hydrides of germanium, silicon and nitrogen, i.e., germane ($GeH_4$), monosilane ($SiH_4$) and ammonia ($NH_3$) are caused to react in an nitrogen atmosphere.

It is not clear whether, in the germanium-containing silicon nitride film thus formed, germanium substitutes for a portion of silicon in silicon nitride or silicon nitride and germanium exist in a merely mixed state. In this respect, however, an analysis with an IMA (ion microanalyzer) has revealed that germanium is distributed in the film very uniformly and that the proportion of the elements in the germanium-containing silicon nitride according to the invention can substantially be expressed as $Ge_x Si_{3-x} N_4$ (where $x = 0.015$ to $0.3$).

The germanium content usable in the invention is 0.5 to 10 atomic-% with respect to the silicon content, and a value of 1 to 4 atomic-% brings forth the most favorable result.

Figure 1:
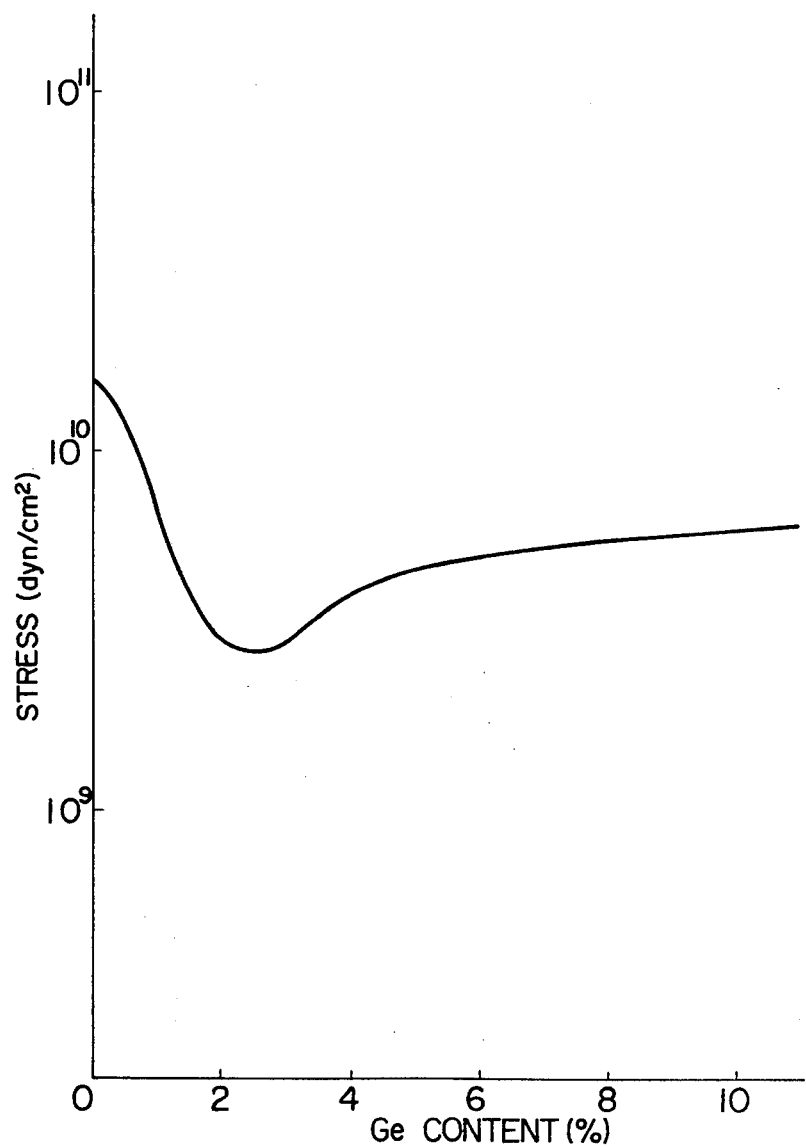
FIG. 1 is a curve diagram showing the relationship between the germanium content of the germanium-containing silicon nitride film according to the invention and the stress of the film.

More specifically, FIG. 1 is a diagram showing the relationship between the germanium content (atomic percent with respect to silicon) in the germanium-containing silicon nitride film and the stress of the film. As is apparent from the figure, the stress of the silicon nitride film is remarkably lowered by doping it with germanium. In particular, where the germanium content is 1 to 4 atomic-%, the effect owing to the germanium doping is very remarkable. The stress of the film in the best case is approximately 1/5 of the stress at the time when there is no germanium doping.

The stress at the time when the germanium content is 0.5 to 1 atomic-% and when it is 4 to 10 atomic-% is about ½ of the stress in the case of non-doping. Such a value can be satisfactorily put into use for the film for a semiconductor device and the fabrication thereof.

Even when the germanium content exceeds 10 atomic-%, the stress is about ½ of the value in the case of non-doping. However, the fineness of the film begins to disappear, or uneven parts arise in the surface of the film. It is, therefore, desirable that the germanium content be 10 atomic-% or less.

When the germanium content is lower than 0.5 atomic-%, the effect of lowering the stress as based on the germanium doping decreases rapidly. It is therefoe necessary that germanium be contained by 0.5 atomic-% or above with respect to the silicon content.

The results of FIG. 1 were obtained as to a film having a thickness of 1,000–1,500 Å. Even when the thickness of the film is changed, the stress acting on a unit sectional area of the film does not change, so that the same results as in FIG. 1 will be obtained at different thicknesses.

It is natural, however, that when the film thickness changes, the sum of the stresses acting on the substrate changes. As the film thickness increases, the total stress acting on the substrate becomes greater.

In the case of the prior art silicon nitride film, the upper feasible limit (maximum value) of the thickness is about 5,000 Å. When the thickness is greater, the film is impracticable because the silicon substrate is deformed or the film cracks.

In contrast, the germanium-containing silicon nitride film according to the invention has a much smaller stress than the silicon nitride film described above. Therefore, even when the thickness was 1 μm, the deformation of the substrate or a crack of the film did not occur.

On the other hand, when the thickness of the germanium-containing silicon nitride film is below 400 Å, satisfactory characteristics cannot be obtained as a mask for the fabrication of a semiconductor device, a protective film of a semiconductor device, etc. It is therefore preferable that the germanium-containing silicon nitride film according to the invention has, in practical use, a thickness of 400 Å to 1 μm when used as a single-layer film.

EXAMPLE 1

A silicon single crystal substrate having a thickness of 340 μm was placed in a quartz reaction tube. Monosilane (SiH₄), germane (GeH₄) and ammonia (NH₃) were caused to flow into the reaction tube together with nitrogen (at a flow rate of about 25 l/min), and the reaction tube was heated to 700° C. Thus, a germanium-containing silicon nitride film was deposited on the silicon single crystal substrate.

A large number of such films of different germanium contents were formed by varying the flow rates of monosilane, germane and ammonia within ranges of 10–40 ml/min, 0.05–1.6 ml/min and 0.5–2.5 l/min, respectively, and the relationship between the germanium content of each film and the stress acting on the film was evaluated. Where the reaction is conducted under such conditions for 3 to 5 minutes, the thickness of the film obtained is 500–5,000 Å.

Then, the same results as in FIG. 1 were obtained, and it was recognized that extraordinarily favorable films are acquired when the germanium content is 0.5 to 10 atomic-% with respect to silicon.

The germanium-containing silicon nitride film whose germanium content falls within the range specified above is substantially the same as the silicon nitride film with respect to its oxidizing rate, etching rate, and film permeability of sodium ions. Therefore, it can be used as a mask for oxidation or diffusion in the fabrication of a semiconductor device or as an insulating or passivation film of a semiconductor device.

When the temperature during deposition exceeds 850° C., germanium does not enter into the film, and only silicon nitride film is formed. When it is below 650° C., the deposition rate of the film becomes very low and is unsuitable for practical use.

It is accordingly appropriate that the temperature in the case of performing CVD falls within a range of 650°–850° C.

EXAMPLE 2

Example 1 employed hydrides for all the raw materials of silicon, germanium and nitrogen. When chlorides of silicon and germanium (for example, SiCl₄, SiHCl₃, SiH₂Cl₂, GeCl₄, etc.,) and hydrazine (N₂H₄) were employed, the same results as in Example 1 were obtained.

EXAMPLE 3

The use of the film according to the invention is very suitable as a mask for producing silica by the thermal oxidation process in the fabrication of a semiconductor device.

Figure 2A:
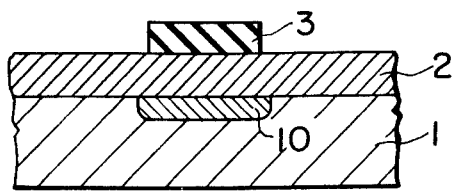
FIGS. 2a through 2c are partial sectional views for explaining the effect of the invention.
Figure 2B:
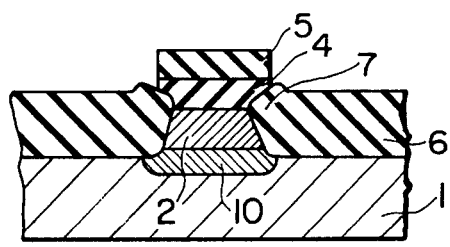

In order to deposit a silicon film on a substrate in the fabrication of a semiconductor integrated circuit of an insulator isolation system, an expedient as illustrated in FIG. 2a and 2b is usually adopted. As shown in FIG. 2a, a silicon layer 2 is epitaxially grown on a silicon substrate 1. Subsequently, a desired part is covered with a mask 3, and thermal oxidation is carried out to oxidize that part of the silicon layer 2 which is not covered with the mask 3.

As the material of the mask 3, the silicon nitride film is excellent for such reasons that the permeability of oxygen is low. As explained above, however, the silicon nitride film has a very large stress. Usually, therefore, a mask which is made up of two layers of silica 4 and silicon nitride 5 as shown in FIG. 2b is employed. Thermal oxidation is thus carried out, to oxidize the exposed part of the silicon layer and to form a silica layer 6. With this method, however, the thermal oxidation is executed under the state under which the silicon layer 2 and the silica 4 lie in contact with each other, so that not only the exposed part on which the mask is not deposited, but also the part covered with the silica 4 of the mask is oxidized considerably deeply. The extension 7 of the silica film 6 in the lateral direction is generally called a "bird beak", and exerts various adverse effects on the characteristics of the semiconductor device.

When the germanium-containing silicon nitride film according to the invention is employed as the mask, such "bird beak" can be greatly suppressed.

Figure 2C:
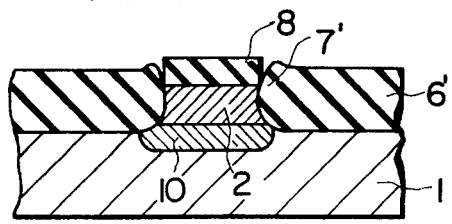

As shown in FIG. 2c, germanium-containing silicon nitride (2,000 Å thick) 8 which contained 2% of germanium was used as the mask deposited on the silicon layer 2. Thermal oxidation was executed in wet oxygen at 1,000° C. for 16 hours. Even when a silica film 6′ being 1.8 μm thick was thus formed, "bird beak" 7′ hardly appeared, and none of the "bird beak" 7′ was greater than 0.5 μm (in the lateral length from an end of the mask 8 towards the interior).

In contrast, when thermal oxidation was carried out under the same conditions by the use of the mask shown in FIG. 2b, "bird beaks" of 1.5-2 μm appeared.

With the film according to the invention, accordingly, the "bird beaks" are greatly reduced. Consequently, difficulties ascribable to the "bird beaks" can be prevented, and the density of integration of a bipolar LSI can be sharply enhanced.

In FIGS. 2a through 2c, numeral 10 designates a collector region formed within the substrate 1.

EXAMPLE 4

In Example 3, the single-layer film of germanium-containing silicon nitride was employed as the mask at the thermal oxidation. When a silicon nitride film is deposited on the germanium-containing silicon nitride film to form a double-layer film and the doublelayer film is employed as a mask at selective thermal oxidation, selective diffusion, selective etching, etc., a more favorable result can be achieved.

As described above, the germanium-containing silicon nitride film according to the invention has the notable merit that the stress is very low. However, it involves the disadvantage that as the germanium content increases, the number of pinholes in the film and the oxidation rate of the film gradually increase. Although the disadvantage can be easily eliminated by making the thickness of the film large, a very large thickness is unfavorable because the advantage of the small stress in the invention is reduced or cancelled.

The above disadvantage can be successfully eliminated be depositing a siicon nitride film on the germanium-containing silicon nitride film. As explained previously, the silicon nitride has the drawback that the stress is very high. This drawback, however, is absorbed by the germanium-containing silicon nitride film intervening between the silicon nitride film and the substrate, so that the adverse influence on the substrate is eliminated.

When the germanium-containing silicon nitride film is too thin, the effect of absorbing the stress is poor, and when it is too thick, not only the stress of the silicon nitride film but also that of the germanium-containing film itself cannot be ignored. It has therefore been revealed that the thickness of the germanium-containing silicon nitride film may be made about 1 to 2 times the thickness of the silicon nitride film. Accordingly, when the thickness of the silicon nitride film is 500–1,000 Å, the thickness of the germanium-containing silicon nitride film usable is 400–2,000 Å. Preferably, the germanium content at this time is 0.5–8 atomic-% of the silicon content.

EXAMPLE 5

Figure 3:
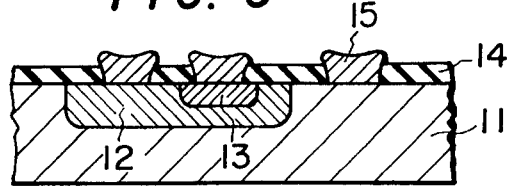
FIG. 3 is a partial sectional view showing an embodiment of the invention.

FIG. 3 shows an embodiment in which the germanium-containing silicon nitride film according to the invention is used as a surface protective film for a bipolar transistor of the planar type.

An n-type silicon substrate 11 was formed with p-type and n-type regions 12 and 13 by respective diffusion steps. A germanium-containing silicon nitride film 14 (whose germanium content was 1.5% of the silicon content thereof) being 3,000 Å thick was deposited by the method explained in Example 1. After forming holes, aluminum wirings 15 were formed. Thus, a bipolar transistor was formed.

The germanium-containing silicon nitride film is waterproof and sodium-proof to the same degree as the silicon nitride film, and moreover, it has a much lower stress than the silicon nitride film as described above. It is therefore very suitable as the protective film of a semiconductor device.

The bipolar transistor fabricated as stated above was let stand in water vapor at 150° C. for 200 hours. Then, the germanium-containing silicon nitride film exhibited no change, and the characteristics of the transistor were not deteriorated.

Where the silicon nitride film is deposited on the germanium-containing silicon nitride film according to the invention and where such a double-layer film is used for the same purpose as in the present example, a preferable thickness of the germanium-containing film is 1,000–8,000 Å and a preferable germanium content is 0.5–4 atomic-% of the silicon content.

While we have shown and described several embodiments in accordance with the present invention it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A germanium-containing silicon nitride film formed on a support surface, wherein the germanium content of said film is 0.5 to 10 atomic% of the silicon content and said film has a thickness of 400 Å to 1 μm.

2. The germanium-containing silicon nitride film according to claim 1, whose composition is represented by $Ge_xSi_{3-x}N_4$, where $0.015 \leq x \leq 0.3$.

3. The germanium-containing silicon nitride film according to claim 1, further comprising a second film which is deposited on said germanium-containing silicon nitride film.

4. The germanium-containing silicon nitride film according to claim 3, wherein said second film is a silicon nitride film.

5. The germanium-containing silicon nitride film according to claim 4, wherein the ratio between thicknesses of said silicon nitride film and said germanium-containing silicon nitride film is 1:1 to 2.

6. The germanium-containing silicon nitride film according to claim 4, wherein the thickness of said silicon nitride film is 500 to 1,000 Å and that of said germanium-containing silicon nitride film is 400 to 2,000 Å.

7. In a semiconductor device having a silicon nitride film disposed on the surface thereof, the improvement wherein said silicon nitride film has a germanium content of 0.5 to 10 atomic % of its silicon content and has a thickness lying in a range from 400 Å to 1 μm.

8. The improvement according to claim 7, wherein said film has the composition $Ge_xSi_{3-x}N_4$, where $0.015 \leq x \leq 0.3$.

9. The improvement according to claim 7, wherein said germanium content is 1 to 4 atomic % that of silicon.

10. The improvement according to claim 7, further including a layer of silicon nitride formed on the germanium-containing silicon nitride film.

11. The improvement according to claim 10, wherein the ratio between thicknesses of said silicon nitride film and said germanium-containing silicon nitride film is 1:1 to 2.

12. The improvement according to claim 11, wherein the thickness of said silicon nitride film is 500 to 1,000 Å and that of said germanium-containing silicon nitride film is 400 to 2,000 Å.

13. In a method of manufacturing a semiconductor device wherein a layer of silicon is selectively masked and the exposed silicon is oxidized to form a silica layer, the improvement comprising the step of selectively masking said silicon layer with a masking layer of silicon nitride having a germanium content of 0.5 to 10 atomic % of its silicon content and having a thickness of 400 Å to 1 μm.

14. The improvement according to claim 13, wherein said masking layer further comprises a silicon nitride film formed on the germanium-containing silicon nitride layer.

15. The improvement according to claim 14, wherein the thickness of the germanium-containing silicon nitride layer is one to two times the thickness of the silicon nitride layer formed thereon.

* * * * *